United States Patent [19]

Heusler

[11] Patent Number: 5,119,339
[45] Date of Patent: Jun. 2, 1992

[54] MEMORY CIRCUIT HAVING AN ERASABLE PROGRAMMABLE MEMORY

[75] Inventor: Lucas Heusler, Zürich, Switzerland

[73] Assignee: U.S. Philips Corp., New York, N.Y.

[21] Appl. No.: 307,657

[22] Filed: Feb. 6, 1989

[30] Foreign Application Priority Data

Feb. 8, 1988 [NL] Netherlands ............ 8800287

[51] Int. Cl.⁵ .............................. G11C 13/00
[52] U.S. Cl. .................. 365/226; 365/189.01
[58] Field of Search ......... 365/226, 189.01, 189.04, 365/230.01, 230.04

[56] References Cited

U.S. PATENT DOCUMENTS 4,926,385 5/1990 Fujishima et al. ............ 365/230.04

Primary Examiner—Terrell W. Fears
Attorney, Agent, or Firm—Steven R. Biren

[57] ABSTRACT

Circuit includes an (E)EPROM and a programming voltage generator. This generator has a charge pump, a programming voltage controller and an edge controller which limits the increase of the programming voltage per unit of time. In the memory circuit, the controllers are fed back to the charge pump in order to switch the charge pump on or off in dependence on the programming voltage variation.

12 Claims, 1 Drawing Sheet

MEMORY CIRCUIT HAVING AN ERASABLE PROGRAMMABLE MEMORY

BACKGROUND OF THE INVENTION

The invention relates to an integrated memory circuit, comprising an erasable programmable memory comprising a generator for generating a programming voltage for the memory, which generator comprises a charge pump and at least one of the following controllers: a voltage controller for limiting the programming voltage, and an edge controller for limiting an increase of the programming voltage per unit of time.

The invention also relates to a generator for generating a programming voltage for the memory, and a voltage controller and an edge controller, both suitable for use in such a generator. A memory circuit and a generator comprising a voltage controller and an edge controller, all of the kind set forth, are known from Netherlands Patent Application 8400225. As is described therein, excessively high programming voltages as well as an excessively high speed at which the programming voltage cross the memory increases are detrimental to the programmable memories (EPROM, EEPROM). In order to mitigate these drawbacks, a state of the art memory circuit is constructed as follows. In series with a charging resistance, a parallel arrangement of the memory on the one side and the edge controller on the other side is inserted between connections of the charge pump. The edge controller comprises a parallel arrangement of a controllable current channel which includes a current channel of a large field-effect transistor, and a series connection of a current channel of a small field-effect transistor with a capacitance. The control electrodes of the large and the small transistor are connected to a junction point between the small transistor and the capacitance. When the charge pump is activated, initially the bulk of the current will be dissipated via the controllable current channel, without contributing to an increase of the programming voltage for the memory. As a small current through the small transistor charges the capacitance further, the current through the large transistor decreases and the voltage across the memory increases. The edge steepness at which this programming voltage increases is codetermined by the dimensions of the transistors and the magnitude of the capacitance. The value of the maximum programming voltage is codetermined by the ratio of the charging resistance and the leakage resistance of the memory, which resistances constitute a voltage divider. Even though this set-up is simple, the known memory circuit can be improved. First of all, the known memory circuit dissipates additional power because the charging current generated by the charge pump initially does not benefit the programming voltage. Secondly, the maximum value of the charging voltage and the edge steepness realized are also dependent on the power delivered by the charge pump. This implies that the charge pump, the charging resistance, the memory and the edge controller must be adapted to one another.

SUMMARY OF THE INVENTION

Therefore, it is an object of the invention to provide a memory circuit comprising a generator for generating a programming voltage where the charge pump does not deliver more power than required for the programming voltage. It is another object of the invention to provide a memory circuit in which the programming voltage is substantially independent of the type of memory and of the type of charge pump, resulting in a wider field of application.

To achieve this, a memory circuit in accordance with the invention is characterized in that the at least one controller generates a control signal for switching the charge pump on or off in dependence on the programming voltage or on a variation of the programming voltage. The programming voltage controls itself via the feedback, also in dependence on the sensitivity of the at least one controller, by making the charge pump operate under the control of the at least one controller.

An embodiment of a memory circuit in accordance with the invention is characterized in that the at least one controller comprises, connected between a first and a second power supply terminal, a series arrangement of a first and a second current source, at least one of the current sources being controllable on a relevant control terminal via a detector for the programming voltage, a control signal being generated on a junction point between the current sources. This set-up results in a sensitive controller and hence the accurate generator. Because an impedance of a current source is very high, a small current variation causes a substantial voltage variation at the junction point. The charge pump is switched on or off in dependence on the control voltage generated on the relevant junction point between the control sources. Switching on and off will be faster, as the controller is more sensitive, so that the desired magnitude and/or edge steepness of the programming voltage are better approximated.

A further embodiment of a memory circuit in accordance with the invention in which the generator comprises the voltage controller is characterized in that one of said current sources in the voltage controller is controllable by the relevant detector whose detector output is connected to the relevant control terminal, which detector comprises a cascode connection with a third current source which is connected between the first power supply terminal and the detector output, a Zener diode which is connected between the detector output and a point carrying the programming voltage, and a current path of an amplifier field-effect transistor which is connected between the detector output and the Zener diode, a control electrode of said transistor being connected to the first power supply terminal and a substrate terminal thereof receiving the programming voltage. As soon as the programming voltage reaches a level equal to the sum of the breakdown voltage of the Zener diode and the threshold voltage of the amplifier field-effect transistor, the voltage on the output of the further cascode circuit changes in a substantially abrupt fashion. This abrupt change is converted into a voltage step on the junction point between the current sources.

A further embodiment of a memory circuit in accordance with the invention is characterized in that the Zener diode comprises a drain diode of a field-effect transistor, the field-effect transistor being contructed so as to have an annular control electrode. The annular shape of the control electrode implies an annular p-n junction in the drain diode of the field-effect transistor. This avoids strongly-curved three-dimensional p-n junctions such as are present in conventional field-effect transistors realized by means of rectangular masks. Because such strongly curved three-dimensional p-n junctions break down sooner than less strongly curved p-n junctions, the proposed Zener diode has a higher breakdown voltage, so that a higher programming voltage can be realized.

Another embodiment of a memory circuit in accordance with the invention in which the generator comprises the edge controller, is characterized in that one of said current sources in the edge controller is controllable by the relevant detector, a detector output of which is connected to the relevant control connection, which detector comprises a further cascode circuit with a fourth current source which is connected between the first power supply terminal and the detector output and with a capacitance which is connected between the detector output and a point carrying the programming voltage. The voltage across the capacitance depends on the one hand on the magnitude of the programming voltage and on the other hand on an equilibrium between a charge to be supplied by the fourth current source and a drawing of charge by the charge pump. When the charge pump draws more charge than is supplied by the fourth current source, the voltage on the detector output decreases and the controllable current source connected thereto is switched. Consequently, the voltage on the junction point between the current sources changes and the charge pump is switched off.

Another embodiment yet of a memory circuit in accordance with the invention is characterized in that between the detector output of the further cascode connection and the capacitance there is connected a current channel of a charging field-effect transistor, a control electrode of which is connected to the first power supply terminal and a substrate terminal of which is connected to the second power supply terminal, a diode being connected at an anode side to a junction point between the capacitance and the charging transistor and at a cathode side to one of the power supply terminals. As a result of the presence of the charging transistor, voltage variations across the capacitance are transformed into voltage levels between the power supply voltages on the first and the second power supply terminal. Thus, these voltage levels are adapted to control voltages for controlling the controllable current source. When the programming voltage decreases, after erasure or programming of the memory, the diode draws the charge on the capacitance to one of the power supply terminals.

BRIEF DESCRIPTION OF THE DRAWING

The invention will be described in detail hereinafter with reference to the drawing, in which.

DESCRIPTION OF THE PREFERRED EMBODIMENTS

Figure 1:
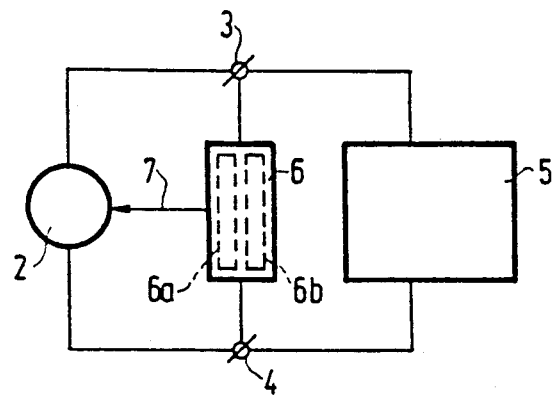
FIG. 1 diagrammatically shows an embodiment of the memory circuit in accordance with the invention.

FIG. 1 diagrammatically shows an embodiment of a memory circuit in accordance with the invention. The memory circuit comprises a charge pump 2 which generates a programming voltage between the terminals 3 and 4 for the programming or erasure of a memory 5. There is also provided a control circuit 6 which comprises a voltage controller 6a for limiting the programming voltage and an edge controller 6b for limiting an increase of the programming voltage per unit of time.

The control circuit is connected to the terminals 3 and 4 and switches the charge pump on or off via the control terminal 7, depending on the magnitude and/or the rate of rising of the programming voltage.

Figure 2:
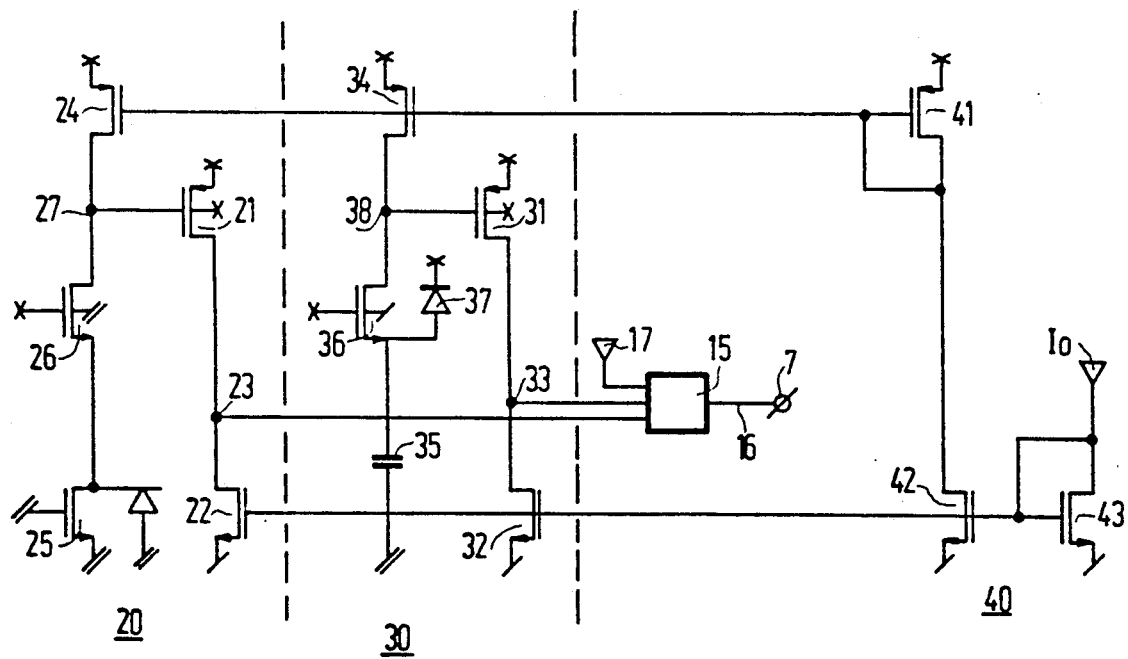
FIG. 2 shows an embodiment of the voltage controller and the edge controller suitable for use in a memory circuit in accordance with the invention.

FIG. 2 shows an embodiment of the voltage controller and the edge controller which are suitable for use in a memory circuit in accordance with the invention. In the Figures, points carrying a first supply voltage $V_{DD}$ are denoted by a cross, points carrying a second supply voltage $V_{SS}$ being denoted by a single oblique stroke while points carrying the programming voltage $V_{EE}$ are denoted by a double oblique stroke. The FIG. 2 shows a logic gate 15 having a logic OR-function, comprising a gate output 16 for connection to a control terminal 7 of the charge pump 2 of FIG. 1, a first gate input thereof being connected to a control output 23 of the voltage controller 20, a second gate input being connected to the control output 33 of the edge controller 30. Any other gate inputs suitable for the reception of control signals other than those originating from the voltage controller and the edge controller are represented by the input terminal 17.

The voltage controller 20 comprises a transistor 21 which is connected as a controllable current source and a transistor 22 which is connected as a constant current source, said transistors being of mutually different conductivity types. The junction point 23 between the current channels of the transistors 21 and 22 constitutes the control output 23 which is connected to the logic gate 15. The detector output 27 of a voltage detector is connected to the control electrode of the transistor 21. The voltage detector comprises, connected between the voltage terminal carrying $V_{DD}$ and the detector output 27, a transistor 24 which is connected as a constant current source, and also comprises, connected between the detector output 27 and a point carrying the programming voltage $V_{EE}$, a cascode connection of a Zener diode element 25 and an amplifier transistor 26. A substrate terminal of the amplifier transistor 26 is connected to $V_{EE}$ and a control connection thereof is connected to $V_{DD}$. The Zener diode element 25 comprises a drain diode of a transistor having an annular control electrode which is connected, like the current channel of the transistor, to $V_{EE}$. The annular shape of the control electrode ensures that the shape of the p-n junction of the diode is also annular. As a result of this geometry, strong three-dimensional curvatures are avoided, for example of the kind present at p-n junctions between a drain, realized by means of a rectangular mask, and the substrate. Consequently, breakdown voltage will be higher. As soon as the programming voltage $V_{EE}$ becomes smaller than the sum of the breakdown voltage of the drain diode of the transistor 25 and the threshold voltage of the transistor 26, the voltage on the detector output 27 decreases and the current source 21 is activated, with the result that the charge pump is switched off via the logic gate 15.

The edge controller 30 comprises a transistor 31 which is connected as a controllable current source and a transistor 32 which is connected as a constant current source, which transistors are of mutually different conductivity types. The junction point between the current channels of the transistors 31 and 32 constitutes the control output 33 and is connected to the logic gate 15. The detector output 38 of an edge detector is connected to the control electrode of the transistor 31. Between the point carrying the voltage $V_{DD}$ and the detector output 38 the edge detector comprises a transistor 34 which is connected as a constant current source; it also comprises, between the detector output 38 and a point carrying the programming voltage $V_{EE}$, a cascode connection of a capacitance 35 and a charging transistor 36. Between a junction point of the capacitance 35 and the charging transistor 36 on the one side and the point carrying the voltage $V_{DD}$ on the other side there is connected a discharging diode 37. As soon as, because of the fast decreasing of the programming voltage $V_{EE}$, more current is drawn from the detector output 38 than is supplied by the transistor 34, the voltage on the detector output 38 decreases, so that the transistor 31 is activated. Consequently, the voltage on the control output 33 increases and the charge pump is switched off via the logic gate 15. The charging transistor 36 serves to shift the voltage variation across the capacitance 35 to logic levels whereby the transistor 31 can be switched on and off. The discharging diode 37 also serves to discharge the capacitance 35 during the rising of the programming voltage $V_{EE}$ when the generator is deactivated. The transistors 22 and 32, being connected as a constant current source, are controlled by means of a current mirror 40 which comprises a reference transistor 43 which conducts a reference current $I_O$ and a follower transistor 42. The transistors 24 and 34, also being connected as a constant current source are also controlled by means of a further mirror via the transistor 41.

I claim:

1. An integrated memory circuit, comprising an erasable programmable memory, a generator for generating a programming voltage for the memory, which generator comprises a charge pump, and at least one of a voltage controller coupled to said generator for limiting the programming voltage and an edge controller coupled to said generator for limiting an increase of the programming voltage per unit of time, wherein the at least one controller generates a control signal for switching the charge pump on or off as a function of at least one of the programming voltage and a variation per unit of time of the programming voltage.

2. An integrated memory circuit as claimed in claim 1, characterized in that the at least one controller comprises, connected between a first and a second power supply terminal, a series arrangement of a first and a second current source, at least one of the current sources being controllable on a relevant control terminal via a detector for the programming voltage, a control signal being generated on a junction point between the current sources.

3. An integrated memory circuit as claimed in claim 2, comprising both a voltage controller and an edge controller, characterized in that the respective junction points between the current sources in the respective series connections are connected to respective gate inputs of a logic gate which switches the charge pump.

4. An integrated memory circuit as claimed in claim 2 or 3, in which the generator comprises the voltage controller, characterized in that one of said current sources in the voltage controller is controllable by the relevant detector whose detector output is connected to the relevant control terminal, which detector comprises a cascode connection with a third current source which is connected between the first power supply terminal and the detector output and a Zener diode which is connected between the detector output and a point carrying the programming voltage.

5. An integrated memory circuit as claimed in claim 4, characterized in that between the detector output and the Zener diode there is connected a current channel of an amplifier field-effect transistor, a control electrode of which is connected to the first power supply terminal, a substrate terminal thereof receiving the programming voltage.

6. An integrated memory circuit as claimed in claim 4, characterized in that the Zener diode comprises a drain diode of a field-effect transistor.

7. A memory circuit as claimed in claim 6, characterized in that the field-effect transistor is constructed so as to have an annular control electrode.

8. An integrated memory circuit as claimed in claim 2, in which the generator comprises the edge controller, characterized in that one of said current sources in the edge controller is controllable by the relevant detector, a detector output of which is connected to the relevant control terminal, which detector comprises a further cascode connection with a fourth current source which is connected between the first power supply terminal and the detector output and with a capacitance which is connected between the detector output and a point carrying the programming voltage.

9. An integrated memory circuit as claimed in claim 8, characterized in that between the detector output of the further cascode connection and the capacitance there is connected a current channel of a charging field-effect transistor, a control electrode of which is connected to the first power supply terminal and a substrate terminal of which is connected to the second power supply terminal.

10. An integrated memory circuit as claimed in claim 9, characterized in that a diode is connected at an anode side to a junction point between the capacitance and the charging transistor and at a cathode side to one of the power supply terminals.

11. An integrated memory circuit as claimed in claim 2, characterized in that in the at least one controller the first current source between the first power supply terminal and the junction point comprises a current channel of a first field-effect transistor of the first conductivity type, a control electrode of which forms the first control terminal, the second current source between the junction point and the second power supply terminal comprising a current channel of a second field-effect transistor of the second conductivity type, which second field-effect transistor constitutes a current mirror in conjunction with a reference field-effect transistor, the reference field-effect transistor conducting a reference current.

12. An integrated memory circuit as claimed in claim 4, characterized in that the current source in said cascode connection comprises a third field-effect transistor of a first conductivity type having a current channel connected between the first power supply terminal and the output of said cascode connection, which third field-effect transistor forms a current mirror in conjunction with a further reference transistor, which further reference transistor conducts a further reference current.

* * * * *